(12) United States Patent
Fairfield et al.

(10) Patent No.: US 12,200,187 B2
(45) Date of Patent: Jan. 14, 2025

(54) IMAGER VERIFICATION SYSTEMS AND METHODS

(71) Applicant: Teledyne FLIR Commercial Systems, Inc., Goleta, CA (US)

(72) Inventors: Nile E. Fairfield, Goleta, CA (US); Randy J. Hansen, Goleta, CA (US); Kelsey M. Judd, Goleta, CA (US); Sean Tauber, Goleta, CA (US); Jeffrey Imamura, Goleta, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 91 days.

(21) Appl. No.: 18/068,453

(22) Filed: Dec. 19, 2022

(65) Prior Publication Data
US 2023/0131678 A1  Apr. 27, 2023

Related U.S. Application Data

(63) Continuation of application No. PCT/US2021/038544, filed on Jun. 22, 2021.
(Continued)

(51) Int. Cl.
*H04N 25/671* (2023.01)
*H04N 17/00* (2006.01)
(Continued)

(52) U.S. Cl.
CPC .......... *H04N 17/002* (2013.01); *H04N 23/11* (2023.01); *H04N 25/671* (2023.01); *H04N 25/69* (2023.01); *H04N 25/78* (2023.01); *H03M 13/09* (2013.01)

(58) Field of Classification Search
CPC .... H04N 17/002; H04N 25/69; H04N 25/671; H04N 25/78
(Continued)

(56) References Cited

U.S. PATENT DOCUMENTS

2014/0247366 A1* 9/2014 Solhusvik ............ H04N 25/771
348/187
2016/0198102 A1 7/2016 Chahine et al.
(Continued)

FOREIGN PATENT DOCUMENTS

WO    WO 2020/049806 A1    3/2020

OTHER PUBLICATIONS

Shafique et al: "A low-power CMOS readout IC with on-chip col. parallel SAR ADCs for microbolometer applications", Proceedings of SPIE, May 25, 2018, Abstract Only, vol. 10624, SPIE, Bellingham, Washington, United States of America, ABSTRACT.

*Primary Examiner* — Joel W Fosselman
(74) *Attorney, Agent, or Firm* — Haynes and Boone, LLP

(57) ABSTRACT

Techniques for facilitating imager verification systems and methods are provided. In one example, an imaging device includes a focal plane array. The focal plane array includes a detector array including a plurality of detectors, where each of the plurality of detectors is configured to detect electromagnetic radiation to obtain image data. The focal plane array further includes a readout circuit configured to perform a readout to obtain the image data from each of the plurality of detectors. The imaging device further includes a processing circuit configured to perform a verification of the imaging device based at least on the image data. Related methods and systems are also provided.

20 Claims, 6 Drawing Sheets

Related U.S. Application Data

(60) Provisional application No. 63/042,520, filed on Jun. 22, 2020.

(51) Int. Cl.
*H04N 23/11* (2023.01)
*H04N 25/69* (2023.01)
*H04N 25/78* (2023.01)
*H03M 13/09* (2006.01)

(58) Field of Classification Search
USPC .......................................................... 348/308
See application file for complete search history.

(56) References Cited

U.S. PATENT DOCUMENTS

2019/0335118 A1  10/2019  Simolon et al.
2021/0217146 A1   7/2021  Yokota et al.

\* cited by examiner

IMAGER VERIFICATION SYSTEMS AND METHODS

CROSS-REFERENCE TO RELATED APPLICATIONS

This application is a continuation of International Patent Application No. PCT/US2021/038544 filed Jun. 22, 2021 and entitled "IMAGER VERIFICATION SYSTEMS AND METHODS," which claims the benefit of U.S. Provisional Patent Application No. 63/042,520 filed Jun. 22, 2020 and entitled "IMAGER VERIFICATION SYSTEMS AND METHODS" all of which are hereby incorporated by reference in their entirety.

TECHNICAL FIELD

One or more embodiments relate generally to imaging and more particularly, for example, to imager verification systems and methods.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, an imaging device includes a focal plane array. The focal plane array includes a detector array including a plurality of detectors, where each of the plurality of detectors is configured to detect electromagnetic radiation to obtain image data. The focal plane array further includes a readout circuit configured to perform a readout to obtain the image data from each of the plurality of detectors. The imaging device further includes a processing circuit configured to perform a verification of the imaging device based at least on the image data.

In one or more embodiments, a method includes detecting, by a plurality of detectors of a focal plane array, electromagnetic radiation. The method further includes performing, by a readout circuit of the focal plane array, a readout to obtain image data from each of the plurality of detectors. The method further includes performing a verification of the focal plane array based at least on the image data.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

Figure 1:
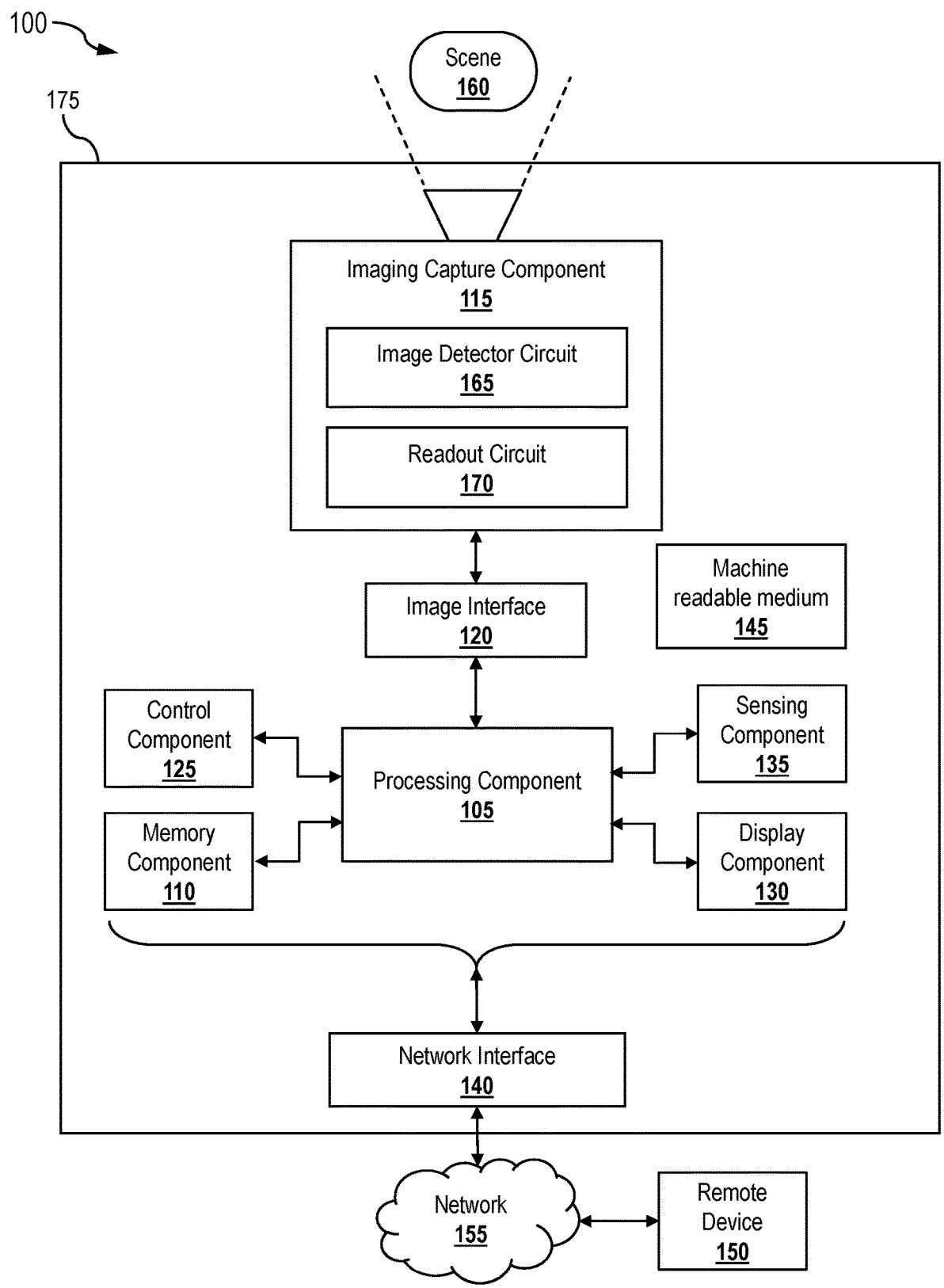
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various systems and methods are provided to facilitate verification of imaging integrity associated with an imaging device. The imaging device may include an FPA and a processing circuit. The FPA may include a detector array and a readout circuit. The detector array includes detectors (e.g., also referred to as detector pixels, detector elements, or simply pixels or elements). Each detector may capture a portion of an incident scene (e.g., incident EM radiation) and generate an associated detector output. The detector output may be an electrical signal (e.g., a voltage or photocurrent)

and may be referred to as a pixel output or image data. The readout circuit performs a readout to obtain image data from each of the detectors indicative of the EM radiation detected by the detectors. The processing circuit may perform a verification of the detector array and/or the readout circuit based at least on the image data.

In some aspects, the FPA may be or may include a unit cell array formed of active unit cells and optionally reference unit cells. Each active unit cell may include a detector. Each reference unit cell may include a detector and a structure (e.g., shutter, lid, cover, paddle) or portion thereof that selectively blocks the detector of the reference unit cell from the scene incident (e.g., incident or external radiation, such as thermal radiation) on the unit cell array. The structure may be used to provide/present a uniform scene to the detectors of the reference unit cells. The detectors of the reference unit cells are effectively blinded from the scene. As such, a reference unit cell and its detector may be referred to as a blind unit cell and a blind detector, respectively. In some aspects, one or more structures (e.g., shutters, lids, covers, and/or paddles) may be selectively positioned to block all the active unit cells, such as to perform calibration of the unit cell array. In some cases, the structure(s) that block the active unit cells may also be positioned over the reference unit cells (e.g., even though the reference unit cells are already blocked by their respective structure).

In some embodiments, integrity verification of the imaging device may be performed to verify pixel data and provide a notification (e.g., to a user) if any failure(s) of the imaging device is detected. The notification may be a diagnostic flag. In some aspects, integrity verification of the imaging device may involve image integrity verification performed by placing (e.g., injecting) known patterns in reference pixels and measuring an associated output from the reference pixels. Placing of known patterns into the reference pixels (e.g., also referred to as non-imaging pixels) may allow verification that image data output by these reference pixels are an expected representation of each pixel's data in a correct address for the unit cell array. In some aspects, integrity verification of the imaging device may involve performing in an imaging device processing pipeline (e.g., a camera pipeline), such as flat-field correction (FFC) events. For example, FFC events may be performed to determine/evaluate effectiveness of a shutter, including determining if the shutter is stuck in an open state or a closed state. In some cases, the FFC events may be performed to determine vacuum health of the detectors of the unit cell array, such as when the detectors are bolometers. Although the present disclosure describes FFC events in which the shutter blocks the detectors of the unit cell array, the shutter may be used to block the detectors for other purposes. In an aspect, any event in which the shutter is used to block the detectors may be referred to as a shutter event.

In general, integrity verification of the imaging device may be performed to detect a presence or an absence of error states (e.g., also referred to as failure modes) and report diagnostics (e.g., to a user). It is noted that, in some cases, detection of a presence or an absence of an error state(s) may be associated with one or more confidence levels. Such a confidence level(s) may be an indication(s) of a probability of a false positive and a false negative. Such integrity verification of the imaging device may be performed to ensure image data provided by the imaging device is not corrupt. Corrupted image data may result in false positives and/or failures in various applications, such as failures to detect objects in an autonomous vehicle's perception system for autonomous vehicle applications. The reported diagnostics may facilitate mitigation of any detected error states.

The user may be alerted of a detected error state(s) using a notification (e.g., a diagnostic flag), such that the user may troubleshoot and/or perform mitigation actions. In an aspect, the diagnostic flag may be or may cause a general-purpose input/output (GPIO) interrupt sent to appropriate circuitry. As non-limiting examples, mitigation actions may include resetting the imaging device (or portion thereof), cycling power associated with the imaging device (or portion thereof) to determine if the error is a transient fault, or replace the imaging device (e.g., replace a camera containing the imaging device with a different camera).

An error state(s) may be communicated to the user via, by way of non-limiting examples, a display on a user device (e.g., mobile phone), a display on a camera that includes the imaging device, and/or via other manners. Such an alert may be a visible alert, such as text or pulses of light emitted by light emitting diodes communicatively coupled to the imaging device, and/or an audible alert, such as beeping by a speaker communicatively coupled to the imaging device. In some cases, the user is alerted wherever an error associated with the imaging device is detected. In some cases, the user is not alerted of an error(s) associated with the imaging device. In some cases, an imaging operation of the imaging device may be stopped in response to a single detected error state and resumed when instructed by the user. In some cases, an imaging operation of the imaging device may be stopped only after a threshold number of errors is detected and/or a certain type(s) of error is detected and resumed when instructed by the user. In some cases, whether and how the imaging device responds to a detected error, such as whether to alert the user of an error(s) and/or stop imaging operation of the imaging device, may be based on application (e.g., application-specific safety requirements), manufacturer preferences, user preferences, and/or other considerations.

Various embodiments of methods and systems disclosed herein may be included in or implemented as various devices and systems such as visible-light imaging systems, infrared imaging systems (e.g., thermal infrared imaging systems), imaging systems having visible-light and infrared imaging capability, mobile digital cameras, video surveillance systems, video processing systems, or other systems or devices that may need to obtain image data in one or multiple portions of the EM spectrum.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 175 in FIG. 1 may represent a housing of the imaging system 100. The housing may contain more, fewer, and/or different components of the imaging system 100 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile, truck), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, 140, etc.) of the imaging system 100 to perform such operations. For example, the processing component 105 may be configured to process captured image data received from the imaging capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The processing component 105 may perform operations to process pixel values received (e.g., as part of frames) from a readout circuit 170 of the imaging capture component 115. By way of non-limiting example, the processing component 105 may perform operations such as non-uniformity correction (NUC) (e.g., FFC or other calibration technique), spatial and/or temporal filtering, and/or radiometric conversion on the pixel values. The processing component 105 may include combinations of hardware and software processing functionality and may be provided with/in and/or communicatively coupled to other components to execute appropriate instructions, such as software instructions and/or processing parameters (e.g., filtering coefficients, NUC correction terms) stored in the memory component 110. In various embodiments, the processing component 105 may be configured to execute software instructions stored in the memory component 110 to perform various methods, processes, or operations in the manner described herein. In some aspects, the readout circuit 170 and/or processing component 105 may include and/or may be coupled to circuitry to generate and provide timing/clock signals and/or control signals for facilitating readout of image data captured by an image detector circuit 165 of the imaging capture component 115. As an example, such a signal may include an $F_{SYNC}$ signal associated with a start of an image and/or an end of frame (EOF) associated with an end of the image.

The memory component 110 includes, in one embodiment, one or more memory devices configured to store data and information, including infrared image data and information. The memory component 110 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the imaging capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes the image detector circuit 165 (e.g., a thermal infrared detector circuit) and the readout circuit 170 (e.g., an ROIC). In some cases, the image capture component 115 does not have a shutter, such that the image detector circuit 165 is exposed to a scene encompassed by a field of view of the image capture component 115. For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) short-wave IR (SWIR) radiation, mid-wave IR (MWIR) radiation (e.g., EM radiation with wavelength of 2 µm to 5 µm), and/or long-wave IR (LWIR) radiation (e.g., EM radiation with wavelength of 7 µm to 14 µm), or any desired IR wavelengths (e.g., generally in the 0.7 µm to 14 µm range). In other aspects, the image detector circuit 165 may capture radiation from one or more other wavebands of the EM spectrum, such as visible-light, ultraviolet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector. By way of non-limiting examples, each detector may be a photodetector, such as an avalanche photodiode, an infrared photodetector, a quantum well infrared photodetector, a microbolometer, or other detector capable of converting EM radiation (e.g., of a certain wavelength) to a pixel value. The array of detectors may be arranged in rows and columns.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to a ADC circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometers may absorb incident IR radiation and produce a corresponding change in temperature in the microbolometers. The change in temperature is associated with a corresponding change in resistance of the microbolometers. With each microbolometer functioning as a pixel, a two-dimensional image or picture representation of the incident IR radiation can be generated by translating the changes in resistance of each microbolometer into a time-multiplexed electrical signal. The translation may be performed by the ROIC. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the imaging capture component 115 may include one or more filters adapted to pass radiation of some wavelengths but substantially block radiation of other wavelengths. For example, the imaging capture component 115 may be an IR imaging device that includes one or more filters adapted to pass IR radiation of some wavelengths while substantially blocking IR radiation of other wavelengths (e.g., MWIR filters, thermal IR filters, and narrowband filters). In this example, such filters may be utilized to tailor the imaging capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may include an IR imaging sensor having an FPA of detectors responsive to IR radiation including near infrared (NIR), short-wave IR (SWIR), MWIR, long-wave IR (LWIR), and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include a network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, image capture component 115, image interface 120, display component 130, sensing component 135, and/or network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2:
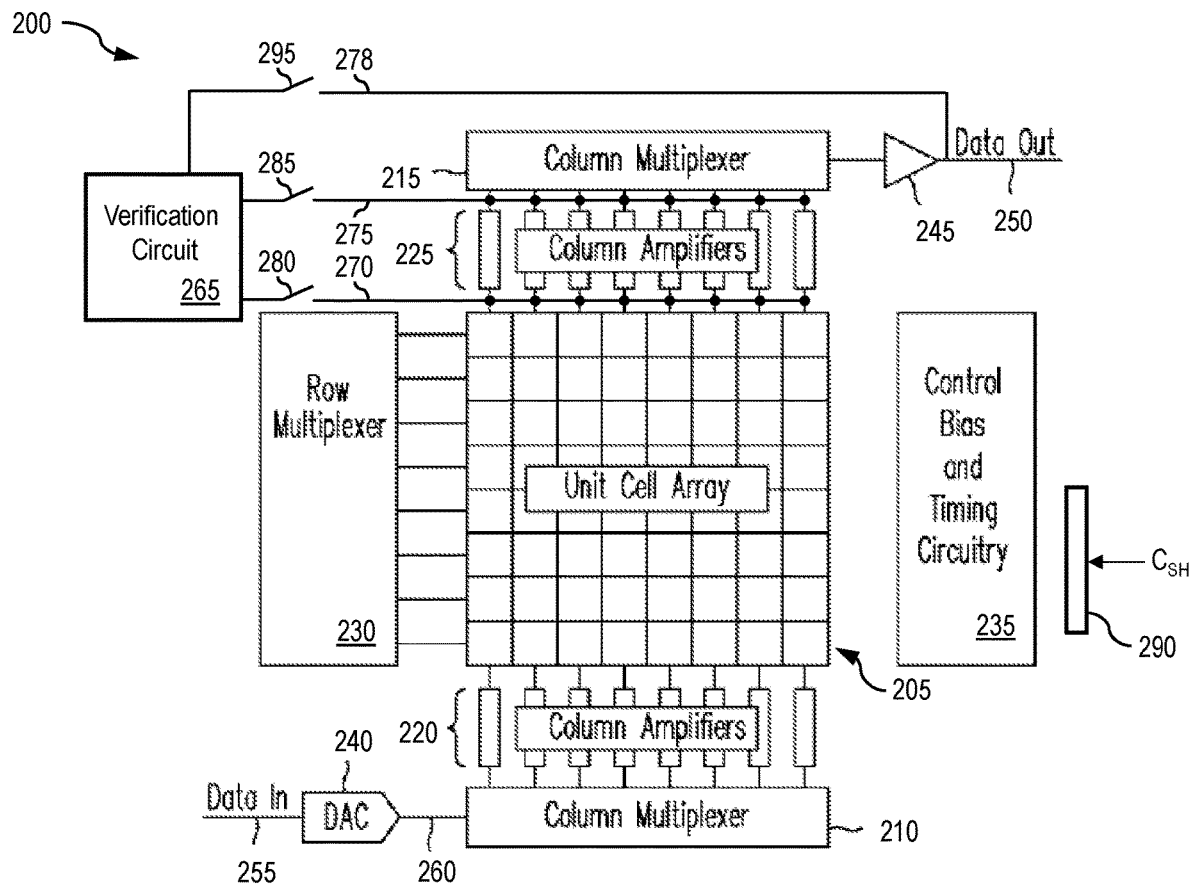
FIG. 2 illustrates a block diagram of an example image sensor assembly in accordance with one or more embodiments of the present disclosure.

FIG. 2 illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the imaging capture component 115 of FIG. 1. In an embodiment, the image sensor assembly 200 may be a part of a camera, such as a thermal infrared camera.

The image sensor assembly 200 includes a unit cell array 205, column multiplexers 210 and 215, column amplifiers 220 and 225, a row multiplexer 230, control bias and timing circuitry 235, a verification circuit 265, a digital-to-analog converter (DAC) 240, and a data output buffer 245. The unit cell array 205 includes an array of unit cells. In an aspect, each unit cell may include a detector (e.g., a pixel) and interface circuitry. The interface circuitry of each unit cell may provide an output signal, such as an output voltage or an output current, in response to a detection signal (e.g., detection current, detection voltage) provided by the detector of the unit cell. The output signal may be indicative of the magnitude of EM radiation received by the detector and may be referred to as image pixel data or simply image data. The column multiplexer 215, column amplifiers 220, row multiplexer 230, and data output buffer 245 may be used to provide the output signals from the unit cell array 205 as a data output signal on a data output line 250. The output signals on the data output line 250 may be provided to components downstream of the image sensor assembly 200, such as processing circuitry (e.g., the processing component 105 of FIG. 1), memory (e.g., the memory component 110 of FIG. 1), display device (e.g., the display component 130 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200. In an aspect, the interface circuitry may be considered part of the ROIC, or may be considered an interface between the detectors and the ROIC. In an embodiment, components of the image sensor assembly 200 may be implemented such that the unit cell array 205 is hybridized to (e.g., bonded to, joined to, mated to) the ROIC. An example of such a hybridization is described with respect to FIG. 3.

The column amplifiers 225 may amplify signals from the unit cell array 205. In some aspects, the column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells. In an aspect, the control bias and timing circuitry 235 may be, may include, or may be a part of, a logic circuit.

In an aspect, the control bias and timing circuitry 235 may generate bias values and timing control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. For example, the DAC 240 may drive digital control signals (e.g., provided as bits) to appropriate analog signal levels for the unit cells. In some technologies, a digital control signal of 0 or 1 may be driven to an appropriate logic low voltage level or an appropriate logic high voltage level, respectively. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the processing component 105 and/or imaging capture component 115 of FIG. 1.

In some embodiments, the control bias and timing circuitry 235 may generate control signals for addressing the unit cell array 205 (e.g., to turn on or turn off switches of a selection circuit) to allow access to and readout of image data from an addressed portion of the unit cell array 205. For explanatory purposes, the unit cell array 205 may be addressed to access and readout image data from the unit cell array 205 row by row, although in other implementations the unit cell array 205 may be addressed column by column or via other manners. In such cases that the unit cell array 205 is addressed row by row, the control signals are appropriately set to address one row of the unit cell array 205 while not addressing any other row of the unit cell array 205. In some cases, the control signals may be digital control signals (e.g., bits) used to derive appropriate signal levels (e.g., an appropriate logic high voltage level or appropriate logic low voltage level) to cause switches of a selection circuit to turn on or turn off. Such appropriate signal levels may be generated by driver circuits of the unit cell array 205 for example. In other cases, the control signals may be analog signals that are at the appropriate signal levels to cause switches of a selection circuit to turn on or turn off.

It is noted that in FIG. 2 the unit cell array 205 is depicted as an 8×8 (e.g., 8 rows and 8 columns of unit cells. However, the unit cell array 205 may be of other array sizes. By way of non-limiting examples, the unit cell array 205 may include 512×512 (e.g., 512 rows and 512 columns of unit cells), 1024×1024, 2048×2048, 4096×4096, 8192×8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as NUC, spatial and/or temporal filtering, and/or other operations. The images (e.g., processed images) may be stored in memory (e.g., external to or local to the imaging system) and/or displayed on a display device (e.g., external to and/or integrated with the imaging system).

It is noted that the various components of FIG. 2 may be implemented on a single chip or multiple chips. Furthermore, while the various components are illustrated as a set of individual blocks, various of the blocks may be merged together or various blocks shown in FIG. 2 may be separated into separate blocks. As a non-limiting example, in some cases, functionality of the verification circuit 265 provided above may be implemented at least in part by the column amplifiers 225. In some cases, the verification circuit 265 may be off chip from other components of the ROIC.

In some aspects, the unit cell array 205 may include active unit cells and, optionally, reference unit cells. Each active unit cell may include a detector that captures a portion of an incident scene and generate an associated output signal. Each reference unit cells may include a detector and a structure (e.g., lid, shutter, cover) that blocks the detector from the scene that is incident on the active unit cells. The structure may be positioned over the detector (e.g., fabricated on top of the detector) to block (e.g., blind) the scene from the detector. A signal output of the blind detector is based on ambient temperature and can be considered as being independent of the scene. The reference unit cells may capture a value (e.g., an absolute value) of a temperature pedestal that is incident on the active unit cells and the reference unit cells. In an aspect, the temperature pedestal may also be referred to as a temperature offset, an ambient temperature pedestal, or an ambient temperature offset.

For example, an FPA (e.g., 100) may include 2048×2048 active unit cells, with 2048×20 reference unit cells positioned in proximity to the FPA. The reference unit cells may be between, around, along the side, or generally positioned relative to the active unit cells such that an ambient temperature experienced by the reference unit cells is equal or substantially equal to an ambient temperature experienced by the active unit cells. In some cases, the reference unit cells may be in the same rows and/or columns as the active unit cells. In some cases, the reference unit cells may be additional columns adjacent to the active unit cells. In some cases, the reference unit cells may be additional rows adjacent to the active unit cells. In some cases, at least one of the reference unit cells may not share a row and/or a column with any active unit cells. In various embodiments, addressing of the unit cell array 205 is generally not dependent on whether an addressed line includes only active unit cells, only reference unit cells, or both active unit cells and reference unit cells.

In some embodiments, the image sensor assembly 200 optionally includes a shutter 290. A control signal $C_{SH}$ may be utilized to selectively cause the shutter 290 to block EM radiation of a scene (e.g., 160) from the unit cell array 205, such as for a calibration process (e.g., also referred to as a calibration event). The calibration process may be or may include an FFC process (e.g., also referred to as an FFC event). FFC generally refers to a calibration technique performed in digital imaging to remove artifacts from frames that are caused by variations in pixel-to-pixel output of the unit cell array 205 (e.g., variations between individual microbolometers of the unit cells) and/or by distortions in an optical path. In an aspect, the FCC event may involve capturing and averaging multiple frames while the shutter 290 is in a closed position to cover the unit cell array 205, such that the unit cell array 205 captures image data of the shutter 290 and is blind to a scene. Such captured frames are accumulated and utilized to update FFC correction terms to be applied to frames output by the ROIC (e.g., by a processing circuit coupled to the image sensor assembly 200 that receives frames output by the readout circuit) and are generally not provided as an output for storage and/or display. In some aspects, to perform an FFC event, the control signal $C_{SH}$ may be set to cause the shutter 290 to block the unit cell array 205. For example, the control signal $C_{SH}$ may be provided to an actuator to cause the actuator to move the shutter 290 such that the shutter 290 blocks the scene from the unit cell array 205. The shutter 290 may block the active unit cells and the reference unit cells (if any).

With the shutter 290 blocking the unit cell array 205, the unit cell array 205 captures image data of the shutter 290 and provides the image data of the shutter 290 to the ROIC. The ROIC may provide image frames containing the image data of the shutter 290 onto the data output line 250. These image frames may be utilized for calibration purposes (e.g., FFC) and are generally not provided (e.g., stored, displayed) for user consumption. For example, processing electronics downstream of the ROIC may receive these pixel data frames and update FFC correction terms based on these received frames. Components downstream of the ROIC may include one or more processors (e.g., to perform image processing operations), one or more memories (e.g., to store processed and/or unprocessed image data), and/or display devices. In an aspect, the processor(s) may be a part of the processing component 105 and/or may be referred to as a host processor. In an aspect, image frames containing image data of the shutter 290 and used to determine FFC correction terms (and updates thereto) may be referred to as FFC frames. An FFC event may be used to generate one or more FFC frames. Once a sufficient amount of image data (e.g., a sufficient number of FFC frames) of the shutter 290 has been captured, the shutter 290 can be positioned such that the shutter 290 does not block the scene from the unit cell array 205 (e.g., the active unit cells of the unit cell array 205 are exposed to the scene). The FFC correction terms may be applied by the processing electronics to image frames containing data associated with the scene (e.g., provided by the ROIC when the unit cell array 205 is not blocked by the shutter 290).

Image data frames containing image data of the scene may be processed, provided to memory (e.g., the memory component 110), and/or provided to a display device (e.g., the display component 130) for display to a user. Image data frames containing calibration data (e.g., from an FFC event) may be processed appropriately to generate calibration parameters that can be applied to subsequent image data frames containing image data of the scene (e.g., for enhanced image quality). These image data frames containing calibration data are generally not provided for user consumption. In this regard, these frames are not provided for storage for the user's retrieval and not provided for display to the user.

In some aspects, in addition to generating FFC correction terms, FFC events may be performed to determine whether the shutter 290 is performing properly. The FFC events may be performed to determine whether the shutter 290 is stuck open or stuck closed. In some cases, such as when the detectors are based on bolometer technologies or similar technologies, the FFC events may determine a vacuum health of the detectors. As an example, changes in a responsivity of one or more unit cells (e.g., detectors of the unit cells) of the unit cell array 205 may be detected to determine/evaluate a vacuum of the detectors. In this example, integrity verification of the image sensor assembly 200 may be performed to detect whether responsivity of one or more unit cells of the unit cell array 205 has degraded. Degraded responsivity may be detected in association with active unit cells and/or reference unit cells. In an aspect, one or more frames from a first FFC event may be compared with one or more frames from a second FFC event. No or one or more intervening FFC events may be between the first and second FFC events. A temperature of the shutter 290 may be measured, such as by a thermistor of or otherwise coupled (e.g., selectively coupled) to the image sensor assembly 200, at a time of the first FFC event and a time of the second FFC event. An estimated/expected change in pixel output between the first and the second FFC event may be determined based at least on a difference in the temperatures of the shutter 290 at the first and second FFC events. In some cases, pixels determined to have responsivity degraded beyond a threshold may be flagged (e.g., as an error state or a possible error state). Such pixels may be identified as degraded pixels or unresponsive pixels. In some cases, a diagnostic flag may be raised to indicate if a threshold proportion/percentage of pixels are determined to have a degraded response and facilitate mitigation action (e.g., by a user). In some cases, image data captured by degraded pixels can be ignored. For a given image, pixel values associated with these pixels may be determined based on pixel values associated with non-degraded pixels (e.g., neighboring non-degraded pixels) and/or pixel values from temporally adjacent images.

In some embodiments, an output signal or a processed version thereof (e.g., processed by the column amplifiers 225, the column multiplexer 215, and/or the data output buffer 245) from one or more unit cells of the unit cell array 205 may be selectively provided to the verification circuit 265 via a line(s) 270, a line(s) 275, and/or a line(s) 278, respectively, by controlling a switch(es) 280, a switch(es) 285, and a switch(es) 295, respectively. Although the line(s) 270 is shown as a single line and the switch(es) 280 is shown as a single switch in FIG. 2, the line(s) 270 may include multiple lines and the switch(es) 280 may include multiple switches, where each of the line(s) 270 is connected to one of the switch(es) 280. Similarly, the line(s) 275 may include multiple lines, the line(s) 278 may include multiple lines, the switch(es) 285 may include multiple switches, and/or the switch(es) 295 may include multiple switches. Furthermore, although the line(s) 270 and 280 are connected to each output line of the unit cell array 205 and the column amplifiers 225, respectively, in some cases only a subset of the output lines of the unit cell array 205 and/or the column amplifiers 225 is selectively connected to the verification circuit 265.

In some aspects, the unit cell array 205 may include one or more rows of reference unit cells and/or one or more columns of reference unit cells. Such reference unit cells may be used to facilitate integrity verification of the image sensor assembly 200 in some aspects. In one case, the switch(es) 280 is closed and an output of the reference unit cells may be received by the verification circuit 265 via the line(s) 270. In one case, the switch(es) 285 is closed and an output of the reference unit cells, as processed (e.g., amplified) by the column amplifiers 225, may be received by the verification circuit 265 via the line(s) 275. In one case, the switch(es) 295 is closed and an output of the reference unit cells, as processed by column amplifiers 225, the column multiplexer 215, and the data output buffer 245 and provided on the data output line 250, may be received by the verification circuit 265 via the line(s) 295. In some cases, the verification circuit 265 may sample the output of the reference unit cells through operation of the switch(es) 280, 285, and/or 295.

As one example, integrity verification associated with ROIC row order may be performed using one or more columns of reference unit cells. A known pattern may be utilized in (e.g., injected into) the column(s) of reference unit cells and output signals indicative of the known pattern may be read out by the ROIC to verify that each row is read out in the correct order. For the integrity verification, the output signals may be compared (e.g., by the verification circuit 265 and/or a processor downstream of the image sensor assembly 200, such as the processing component 105) to a pattern expected to be output by the reference unit cells in response to injection of the known pattern. Error states associated with ROIC row order may include a single row repeating over and over or having two rows swap order.

In some aspects, the known pattern may define a respective electrical signal (e.g., voltage signal) to be injected into each detector of the reference unit cell for readout by the ROIC. The row order may be verified by comparing an output signal of these reference unit cells as read out by the ROIC with an output signal expected to be read out by the ROIC.

In some aspects, the known pattern may include signals associated with biasing the reference unit cells of the unit cell array 205 to cause an output to be generated by the reference unit cells for readout by the ROIC. A deviation of an output generated by the reference unit cells as read out by the ROIC from the output expected to be generated by the reference unit cells in response to the known bias signals may indicate a presence of an error state. In some cases, the known pattern may be generated in the reference unit cells using calibration terms (e.g., per-pixel calibration terms) selected to rail each reference unit cell to a pixel low or pixel high. For example, the known pattern may include a binary pattern. Table 1 below provides a pattern formed of a binary pattern that repeats every four rows. Such a pattern allows every four rows to be verified. In some cases, appropriate electrical signals (e.g., voltage, current) may be generated in response to the binary pattern. As one example, a binary 0 may cause generation of a logic low voltage level and a binary 1 may cause generation of a logic high voltage level. This voltage may then be provided as a bias signal to the appropriate reference unit cell. In one example, a binary 0 may be associated with not applying a bias signal to a reference unit cell. A checksum of each test column may be generated (e.g., by the verification circuit 265) based on the output of the reference unit cells and, if correct, all the rows may be determined to be in the correct order. Otherwise, an error state may be determined to be present.

TABLE 1

Example pattern for facilitating ROIC row order verification

| Row number | Signal injected into reference column #1 | Signal injected into reference column #2 |
|---|---|---|
| 1 | 0 | 0 |
| 2 | 1 | 0 |
| 3 | 0 | 1 |
| 4 | 1 | 1 |
| 5 | 0 | 0 |
| 6 | 1 | 0 |
| 7 | 0 | 1 |
| 8 | 1 | 1 |
| 9 | 0 | 0 |
| 10 | 1 | 0 |
| 11 | 0 | 1 |
| 12 | 1 | 1 |

In some cases, during a manufacturing and/or calibration process of the image sensor assembly 200 at a factory, an appropriate bias signal level to apply may be determined for various operating temperatures (e.g., of an FPA) and/or ambient temperatures. Similarly, for a given reference unit cell, an output expected to be generated may be determined for various bias levels, at various operating temperatures, and/or at various ambient temperatures. These expected outputs (e.g., expected pixel outputs and/or representations of these pixel outputs) may be stored in memory of, coupled to, and/or otherwise accessible to the image sensor assembly 200. When the unit cell array 205 is used in the field, the appropriate expected output values for a given known pattern compared with an output generated by the reference unit cells when the known pattern is applied.

As another example, alternatively or in addition to integrity verification associated with ROIC row order, integrity verification associated with ROIC column order may be performed using one or more rows of reference unit cells. A known pattern may be utilized in (e.g., injected into) the row(s) of reference unit cells and output signals indicative of the known pattern may be read out by the ROIC to verify that each column is read out in the correct order. For the integrity verification, the output signals may be compared (e.g., by the verification circuit 265 and/or a processor downstream of the image sensor assembly 200, such as the processing component 105) to a pattern expected to be output by the reference unit cells in response to injection of the known pattern. Error states associated with ROIC column order may include a single column repeating over and over or having two columns swap order.

In some aspects, the known pattern may define a respective electrical signal (e.g., voltage signal) to be injected into each detector of the reference unit cell for readout by the ROIC. The column order may be verified by comparing an output signal of these reference unit cells as read out by the ROIC with an output signal expected to be read out by the ROIC.

In some aspects, the known pattern may include signals associated with biasing the reference unit cells of the unit cell array 205 to cause an output to be generated by the reference unit cells for readout by the ROIC. A deviation of an output generated by the reference unit cells as read out by the ROIC from the output expected to be generated by the reference unit cells in response to the known bias signals may indicate a presence of an error state. In some cases, the known pattern may be generated in the reference unit cells using calibration terms (e.g., per-pixel calibration terms) selected to rail each reference unit cell to a pixel low or pixel high. For example, the known pattern may include a binary pattern. Table 2 below provides a pattern formed of a binary pattern that repeats every four columns. Such a pattern allows every four columns to be verified. A checksum of each test row may be generated (e.g., by the verification circuit 265) and, if correct, all the columns may be determined to be in the correct order.

TABLE 2

Example pattern for facilitating ROIC column order verification

| Column number | 1 | 2 | 3 | 4 | 5 | 6 | 7 | 8 | 9 | 10 | 11 | 12 |
|---|---|---|---|---|---|---|---|---|---|---|---|---|
| Signal injected into reference row #1 | 0 | 1 | 0 | 1 | 0 | 1 | 0 | 1 | 0 | 1 | 0 | 1 |
| Signal injected into reference row #2 | 0 | 0 | 1 | 1 | 0 | 0 | 1 | 1 | 0 | 0 | 1 | 1 |

As another example, alternatively or in addition to integrity verifications described above, integrity verification associated with the column amplifiers 225 may be performed using one or more rows of reference unit cells. In some cases, an output associated with the reference unit cells as processed (e.g., amplified) by the column amplifiers 225 may be provided to the verification circuit 265 via the line(s) 275 and/or the data output line 250. Each of the column amplifiers 225 may receive an output from a corresponding column of the unit cell array 205 via a corresponding one of a plurality of parallel data interfaces. The output signals may be compared (e.g., by the verification circuit 265 and/or a processor downstream of the image sensor assembly 200, such as the processing component 105) to a pattern expected to be output by the column amplifiers 225 in response to injection of the known pattern into the reference unit cells. Such image integrity verification may verify that each column is amplified within a desired range. In one example, the same test pattern may be provided in (e.g., injected into) each row of reference unit cells. The test pattern may be generated using calibration terms.

As another example, alternatively or in addition to integrity verifications described above, integrity verification may be performed to determine/evaluate a functionality of a parallel data interface. Such verification may use a known pattern in one or more columns of reference unit cells and one or more rows of reference unit cells to verify a full range of values. In some cases, the parallel data interface may be used to provide (e.g., in parallel over multiple interfaces) a 0 or a 1 on each interface according to the desired injection pattern to one or more driver circuits to cause the driver circuit(s) to generate a bias signal at a logic low level or a logic high level and apply the bias signal to a reference unit cell. For example, each column of the unit cell array 205 may be coupled to one interface of the parallel data interface. An output generated based on the known pattern may be provided to the verification circuit 265 and/or a processor (e.g., the processing component 105) via the data output line 250. The processor may verify the pattern of the outputs associated with the rows and columns to confirm that a parallel data interface successfully toggles bits from low to high, and vice versa.

As another example, alternatively or in addition to integrity verifications described above, integrity verification may be performed to determine/evaluate a functionality of a data output interface. Such verification may use a known pattern in one or more columns of reference unit cells and one or more rows of reference unit cells to verify a full range of values. In an aspect, the outputs of the column amplifiers 225 are provided as parallel outputs (e.g., via a parallel data interface) to the column multiplexer 215. The column multiplexer 215 may generate serial data from the parallel outputs of the column amplifiers 225 and provide the serial data to the data output buffer 245. The serial data may also be provided to the verification circuit 265 via the line 278 and the switch 295. For example, the verification circuit 265 may sample the data output line 250.

In some cases, a serial data command word may be generated by a processor (e.g., a processor downstream of the data output line 250 such as the processing component 105) and sent to the ROIC via an interface. The serial data command word may be a configuration command sent to the ROIC that enables/disables certain modes on the ROIC to change operating modes of the ROIC. The processor may determine a cyclic redundancy code (CRC) based on the serial data command word and send the serial data command word along with the CRC over the interface to the ROIC. A circuit of the ROIC (e.g., the verification circuit 265 or other circuit) may receive the serial data command word and the CRC. The circuit of the ROIC may determine (e.g., calculate) a CRC based on the serial data command word and compare the determined CRC with the CRC received from the processor. If the CRCs match, the serial data command word may be determined to not have been corrupted in transmission over the interface. If the CRCs do not match, corruption of the serial data command word and/or the received CRC may be determined to have been corrupted in transmission over the interface. A pass/fail confirmation of the ROIC may be sent (e.g., as a flag) back over the data output line 250 (e.g., a video data path). The processor may verify a functionality of the interface based on the pass/fail confirmation.

In some cases, a data CRC may be generated by the verification circuit 265 based on a data of a row of the unit cell array 205 and sent on a data output interface along with the row data to the processor for verification. The processor may generate a data CRC based on the received row data. The processor may verify the row data by determining a data CRC based on the row data and compare this determined data CRC with the received data CRC. If the CRCs match, the row data may be determined to not have been corrupted in transmission over the data output interface. A mismatch between the CRCs indicate a corrupted transmission of data from the ROIC to the processor via the data output interface. The processor may verify a functionality of the data output interface based on whether there is a mismatch between the CRCs. In an embodiment, with respect to FIG. 2, the data output interface may be implemented by the data output line 250.

In one aspect, integrity verification may be performed to determine if an ROIC is in sync with a pipeline associated with the image sensor assembly 200. The ROIC may associate each frame with a frame number and provide the frame and frame number on the data output line 250. The ROIC may include a frame counter that increments for each frame. A processor coupled to the data output line 250 may receive the frame and the frame number and verify the frame counter, such as against a clock, a counter, or other means of the processor that is adjusting at the same rate. Such verification is a verification of whether the processor is in sync with the image sensor assembly 200. In some cases, the ROIC may increment the frame counter upon detecting an EOF associated with a frame.

In one aspect, integrity verification may be performed to determine if a frame in an output buffer was not refreshed. The output buffer not being refreshed may cause repeated frames to be output on the data output line 250. The output buffer may be implemented by the data output buffer 245. In some cases, such an integrity verification may be performed by generating (e.g., by the verification circuit 265) row data CRC in telemetry prior to loading in the data output buffer 245. If the row data CRC does not match, the frame in the data output buffer 245 was not refreshed.

In some cases, the verification circuit 265 may generate a CRC for each row and provide the CRC along with the row data on the data output line 250. In some cases, the verification circuit 265 may generate CRCs separately for each data line. In an implementation, there may be two data lines (e.g., one for even columns and another for odd columns), with each data line having its own CRC for every row. In some cases, the ROIC has a row counter used to confirm a correct row has been addressed. A processor (e.g., the processing component 105) downstream of and coupled to the data output line 250 may generate a CRC as the data is received from the verification circuit 265 and compare this generated CRC to the CRC received to verify integrity of the data transfer.

In one aspect, integrity verification may be performed to determine if there may be excessive spatial noise in a frame captured during an FFC event. In this regard, this frame is captured when the shutter 290 closes to block the unit cell array 205. The spatial noise may be quantified as a pixel to pixel deviation in an output of the unit cell array 205. For example, the spatial noise may include spatial three-dimensional noise components and may be, or may be based on, a standard deviation of pixel outputs of the unit cell array 205. In some cases, the determination may be made by a processor downstream of the ROIC. The processor may be part of the processor component 105 of FIG. 1 and may receive the frame from the data output line 250. If the spatial noise exceeds a noise threshold, an error state, such as a reduced confidence warning, may be raised. In some cases, if the spatial noise is determined to be above the spatial noise threshold, a determination may be made (e.g., by the processor) that the shutter 290 is not fully closed. In this regard, the spatial noise being high may be indicative of the shutter 290 not being fully closed (e.g., at least partially stuck open) and thus not blocking the scene from the unit cell array 205. In some cases, the shutter 290 may be partially stuck open such that a subset of active unit cells of the unit cell array 205 are blocked from the scene and another subset of active unit cells are not blocked from the scene.

In one aspect, integrity verification may be performed to verify parameter fidelity. In some cases, a set of parameters may be stored in memory (e.g., RAM). The stored set of parameters may be compared with another copy of this set of parameters to determine whether the parameters are identical. In some cases, a CRC may be generated for each copy of the set of parameters and compared. In some cases, the comparison may be performed on a periodic basis. A diagnostic flag may be raised if a difference between the sets of parameters is present. If the user changed the setting, the user may clear the diagnostic flag and/or update one or more copies of the sets of parameters such that they are consistent. Storage of a redundant set of parameters and associated verification may be performed to mitigate a single event upset (SEU), which may be caused by a cosmic ray and/or other large EM radiation that may corrupt memory in a static state, since a probability of the exact same disturbance occurring to the redundant sets of parameters at the same time is low. The set of parameter may be used for safety critical algorithms. For example, the set of parameters may include parameters related to object recognition, image filtering coefficients, FFC terms and/or other calibration terms, and/or other parameters.

In one aspect, integrity verification may be performed to verify a functionality of pixels of the unit cell array 205. Scene movement can be determined/predicted based on an inertial measurement unit (IMU). The IMU may be located on the optical axis, directly behind the FPA. In cases that the IMU is located in a fixed position elsewhere, movement of the FPA relative to the IMU can be inferred. In some cases, the scene movement may be determined by using edges found in the scene and predicting trailing effects based on measured motion. Pixels that do not exhibit motion blur to a degree expected based on the IMU may be marked as possibly being defective. In an aspect, the IMU may be part of the processing component 105 or in communication with the processing component 105.

In some cases, fixed objects in a dynamic scene while the image sensor assembly 200 is stationary may be used as reference objects for observed blur later on when the image sensor assembly 200 is in motion. As an example, these objects can be determined to be stationary by capturing multiple frames while the image sensor assembly 200 is stationary, taking a mean of the frames, and subtracting the mean from future frames captured by the image sensor assembly 200 to obtain a difference image. Pixels of the difference image having a pixel value of zero counts or near zero counts may be associated with stationary objects.

In some cases, blur estimation may be performed by treating movement as a point spread function. Blur estimation may involve determining a convolution matrix from an IMU input and a priori knowledge of a detector thermal time constant (e.g., a bolometer thermal time constant). The IMU may provide a frame to frame change of the imaging plane in three-dimensional space, where the projection in the imaging plane between a previous frame and a current frame may be used to calculate an expected blur of selected objects in the current frame based on the previous frame.

As an example of defective pixel detection when the image sensor assembly 200 is coupled to a vehicle, the previous frame may be convolved with the determined convolution matrix and compared to an incoming frame while the vehicle is making a turn at an intersection. Differences between the incoming frame and an expected future frame on identified stationary objects (e.g., streetlights, signs) may be flagged using a thresholding technique where outliers may be identified as being associated with defective pixels. A utility of this technique may be higher when identified stationary objects cross an entire frame, with a sweeping trail of pixels behind. In some cases, a vehicle speed and heading may be provided as a potential input to an imaging system that includes the image sensor assembly 200 for use in the defective pixel detection instead of or in addition to the IMU input.

Figure 5:
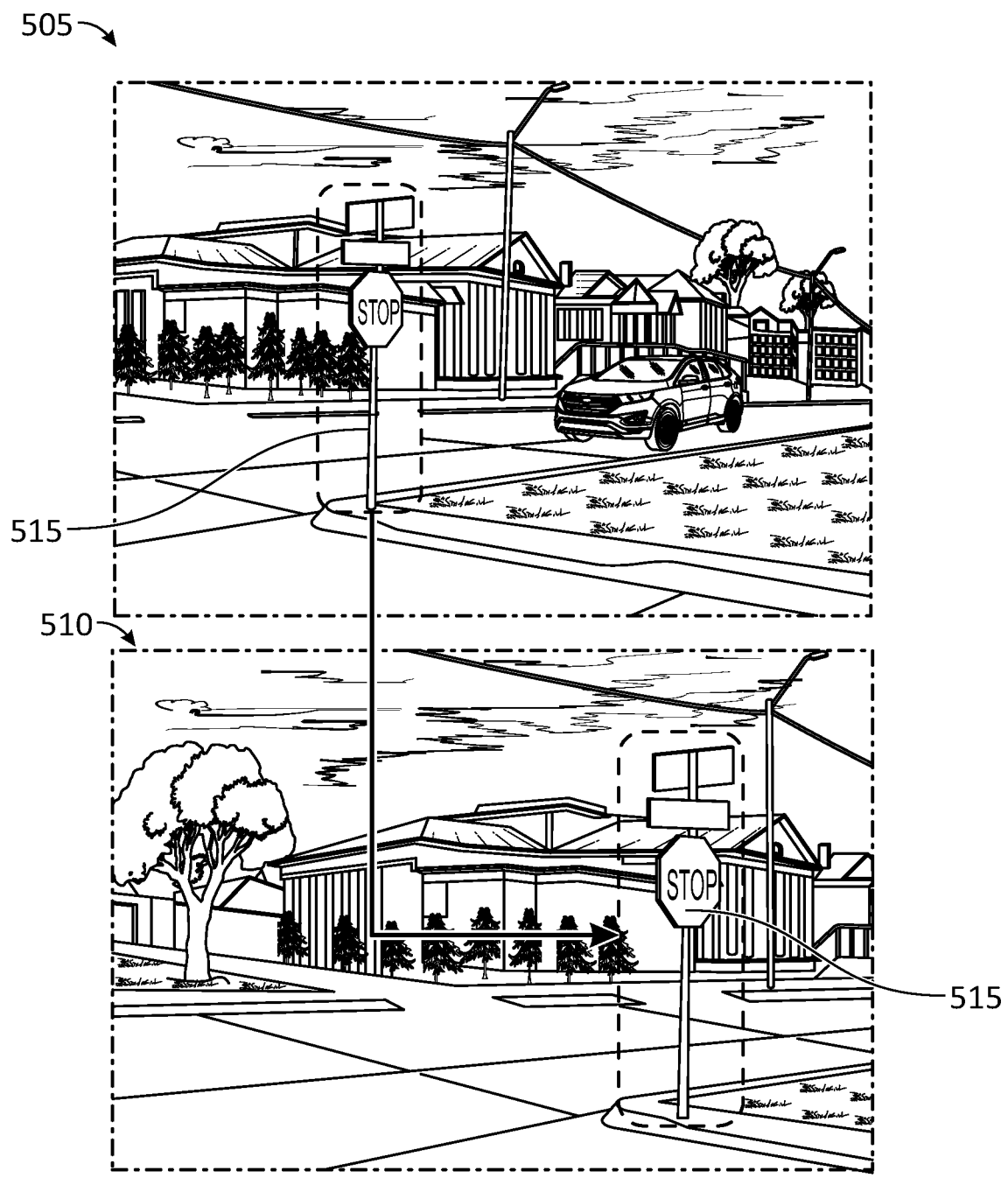
FIG. 5 provides example frames for facilitating defective pixel detection in accordance with one or more embodiments.

As an example, FIG. 5 provides example frames 505 and 510 for facilitating defective pixel detection in accordance with one or more embodiments. In an embodiment, the image sensor assembly 200 is mounted to a vehicle (e.g., a car) and the frames 505 and 510 may be captured by the image sensor assembly 200 as the vehicle is making a left turn. The frame 505 may be captured at a time $t=t_1$ and the frame 510 may be captured at a later time $t=t_2$ as the vehicle is making the left turn. An object 515 (e.g., a stop sign) may be identified as a stationary object and used to facilitate defective pixel detection. For example, objects, such as the object 515, associated with predictable motion blur trails may be used to identify pixels that are not responding (e.g., generating outputs in response to received radiation) as expected. In some cases, in addition or alternative to the object 515, any edges, contours, and/or other high frequency components in the frames 505 and 510 may be used to facilitate defective pixel detection.

Figure 6:
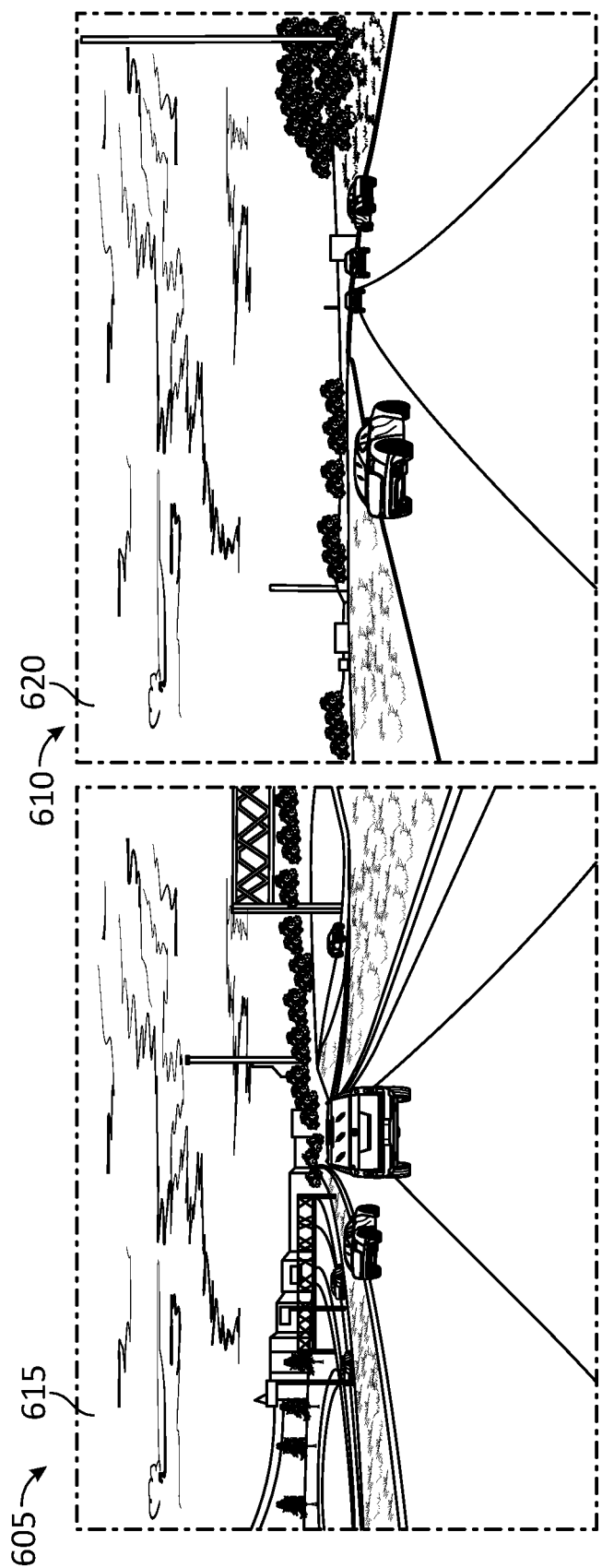
FIG. 6 provides example frames for facilitating stereo defective pixel detection in accordance with one or more embodiments.

In one aspect, integrity verification may be performed for stereo camera error detection. The image sensor assembly 200 may be used with another image sensor assembly. As an example, consider that the image sensor assembly 200 is provided in a first camera and the other image sensor assembly is provided in a second camera. These cameras may be configured (e.g., positioned, pointed) to stare at the same scene with intentional overlap. Image data captured by these cameras may allow the cameras to inform each other of their performance. For example, a disagreement in the measured scene content can be fed to each camera and each camera can compare and raise a flag as appropriate. In some cases, the overlapping area can be defined in the camera and an average value for the overlapping area can be reported as a diagnostic that a host can use for voting. A depth can be inferred from the stereo configuration. Long range objects (e.g., mountains) can be sampled between two frames. The two frames should have similar values. If values associated with the same portion of the scene differ beyond a threshold between the two frames (e.g., especially in the overlapping area), pixels that captured these values can be reported as possibly being defective. As an example, FIG. 6 provides example frames 605 and 610 for facilitating stereo defective pixel detection in accordance with one or more embodiments. The first camera may capture the frame 605 and the second camera may capture the frame 610. The frame 605 has a region 615 (e.g., capturing the sky) and the frame 610 has a region 620 that can be used to facilitate stereo defective pixel detection.

Using various embodiments, integrity verification may be performed in real time or near real time. Such integrity verification capability may increase a functional safety setting and may be implemented to allow failures of integrity of an imaging device to be detected and flagged within a time frame appropriate for various applications, such as functional safety and automotive applications. For various applications, such as automotive safety compliance, aspects of integrity verification may be performed with each frame captured by the imaging device such that a presence of an error state(s) may be detected and reported within a frame time. For example, for every frame that is read out by the ROIC, data associated with a row(s) of reference unit cells and/or a column(s) of reference unit cells may be read out along with image data from active unit cells. As such, verification may be performed based on outputs associated with the reference unit cells while image data associated with the scene is captured and read out (e.g., for display, processing, and/or storage).

Figure 3:
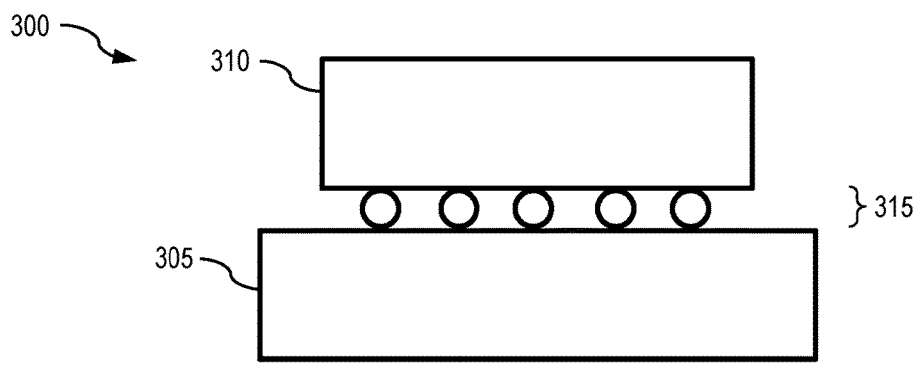
FIG. 3 illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 3 illustrates an example image sensor assembly 300 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 300 may be, may include, or may be a part of the image sensor assembly 200.

The image sensor assembly 300 includes a device wafer 305, a readout circuit 310, and contacts 315 to bond (e.g., mechanically and electrically bond) the device wafer 305 to the readout circuit 310. The device wafer 305 may include detectors (e.g., the unit cell array 205). The contacts 315 may bond the detectors of the device wafer 305 and the readout circuit 310. The contacts 315 may include conductive contacts of the detectors of the device wafer 305, conductive contacts of the readout circuit 310, and/or metallic bonds between the conductive contacts of the detectors and the conductive contacts of the readout circuit 310. In one embodiment, the device wafer 305 may be bump-bonded to the readout circuit 310 using bonding bumps (e.g., indium bumps). The bonding bumps may be formed on the device wafer 305 and/or the readout circuit 310 to allow connection between the device wafer 305 and the readout circuit 310. In an aspect, hybridizing the device wafer 305 to the readout circuit 310 may refer to bonding the device wafer 305 (e.g., the detectors of the device wafer 305) to the readout circuit 310 to mechanically and electrically bond the device wafer 305 and the readout circuit 310.

Figure 4:
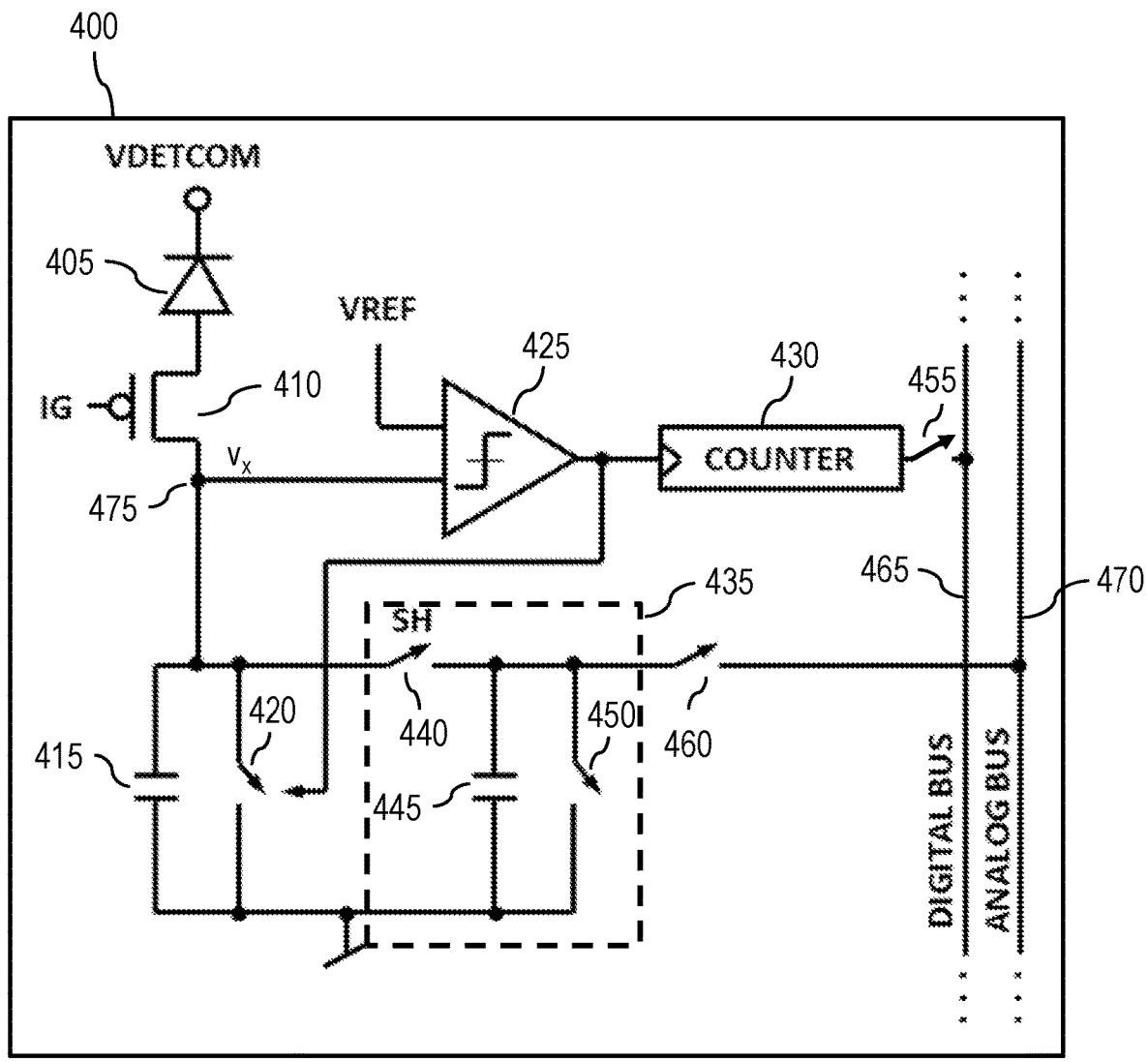
FIG. 4 illustrates an example unit cell in accordance with one or more embodiments of the present disclosure.

FIG. 4 illustrates an example of a unit cell 400 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the unit cell 400 may be a unit cell of the unit cell array 205 of FIG. 2.

The unit cell 400 includes a detector 405, a transistor 410, a capacitor 415, a switch 420, a comparator 425, and a counter circuit 430. By way of non-limiting example, the detector 405 may be a photodetector (e.g., avalanche photodiode, infrared photodetector, quantum well infrared photodetector), a bolometer (e.g., microbolometer), or other detector capable of converting EM radiation (e.g., of a certain wavelength) to a detector signal (e.g., detector current). The detector 405 is connected to a detector voltage supply, denoted as $V_{DETCOM}$, and the transistor 410. The detector 405 may generate a detector signal (e.g., detector current) based on captured EM radiation. A bias signal (e.g., a bias voltage $I_G$) may be applied to the transistor 410 (e.g., a gate of the transistor 410) and may allow the transistor 410 to provide the detector signal from the detector 405 to the capacitor 415 based on EM radiation (e.g., IR light) incident on the detector 405 during an integration period. For example, the detector signal may be provided to the capacitor 415 by direct injection. In an aspect, the bias signal may be provided by the control bias and timing circuitry 235 shown in FIG. 2. The unit cell 400 may be an active unit cell or a reference unit cell (e.g., with structure overlying the detector 405 not shown in FIG. 4). In an embodiment, a known signal may be injected directly into the detector 405 (e.g., and other detectors of the unit cell array for integrity verification purposes). In an aspect, an output of the detector 405 (e.g., as provided on a digital bus 465 and an analog bus 470) in response to the injected signal may be compared to an expected output for integrity verification purposes.

A voltage $v_x$ at a node 475 between the transistor 410 and the capacitor 415 increases in magnitude as the detector signal (e.g., detector current) is provided to and integrated by the capacitor 415. In an aspect, the voltage $v_x$ may be referred to as an integration voltage and the node 475 may be referred to as an integration node. In this regard, the voltage $v_x$ may be a voltage ramp whose slope is proportional to the magnitude of the detector signal. The magnitude of the detector signal is proportional to the magnitude of the EM radiation captured by the detector 405. The comparator 425 compares the voltage $v_x$ with a reference voltage $V_{REF}$. In an aspect, analog signals on the analog signal line(s) 260 shown in FIG. 2 may allow setting of a different $V_{REF}$ for different unit cells. For example, the reference voltage $V_{REF}$ for the unit cell 400 may be different from a reference voltage $V_{REF}$ of another unit cell. In an aspect, the reference voltage $V_{REF}$ may be, or may be referred to as, a controllable voltage threshold level or a per-pixel reference voltage. As an example, the reference voltage $V_{REF}$ may be between 1.5 V and 2.5 V.

When the voltage $v_x$ exceeds the reference voltage $V_{REF}$ (e.g., in magnitude), the comparator 425 may generate one or more outputs to increment a counter value and cause reset of the capacitor 415. In this regard, an output of the comparator 425 may cause the counter circuit 430 to increment a counter value. An output of the comparator 425 may cause the switch 420 to be closed and cause the capacitor 415 to discharge. In some cases, a single output may be routed to both the switch 420 and the counter circuit 430. In an aspect, additional circuitry may be provided along the path between the comparator 425 and the switch 420. For example, buffers (e.g., non-inverting buffers, inverters) may be provided to appropriately buffer control signals provided by the comparator 425 to the switch 420. The use of such buffers may facilitate appropriate timing associated with integrating at the capacitor 415 and resetting of the capacitor 415.

In an aspect, the comparator 425 may generate an output signal of a logic level '0' when the voltage $v_x$ does not exceed the reference voltage $V_{REF}$. For example, the comparator 425 may include or may be coupled to a 1-bit analog-to-digital converter (ADC) that generates the output signal of the logic level '0'. At a moment when the voltage $v_x$ exceeds the reference voltage $V_{REF}$, the 1-bit ADC may transition its output signal from a logic level '0' to a logic level '1' to cause the counter circuit 430 to increment the counter value and the switch 420 to be closed to reset the capacitor 415. In this regard, the comparator 425 may generate a digital output or may generate an analog output that can be converted (e.g., via a 1-bit ADC) to a digital value (e.g., 0 or 1). Once the capacitor 415 is reset (e.g., cleared of voltage), the switch 420 may be opened and another cycle of the conversion process (e.g., integration of detector signal by the capacitor 415, incrementing the counter value by the counter circuit 430, and resetting the capacitor 415) may be performed. Conversion cycles may be performed for the duration of the integration period. In this regard, an output of the counter circuit 430 is a counter value (e.g., representable using bits) indicative of a portion of the magnitude of the detector signal. In an aspect, during the conversion cycles, a switch 440 may be opened (e.g., in an off state) to allow integration of the detector signal by the capacitor 415. In an aspect, the switch 420 may be considered a reset circuit that resets the capacitor 415.

When a switch 455 is closed, the counter value of the counter circuit 430 at the end of the integration period may be provided to the digital bus 465 to be read by column circuitry (e.g., 215 and/or 225 in FIG. 2). For example, the switch 455 may be closed when a row of the unit cell array (e.g., 205) that includes the unit cell 400 is being read out. The switch 455 may be referred to as a row-select switch, a readout switch, or a row-readout switch. In an aspect, the counter value may be held (e.g., buffered) until the time of read out. In some cases, the digital bus 465 may provide the counter value to the column multiplexer 215 without any intervening processing. For example, the counter value may bypass the column amplifiers 225 or pass through the column amplifiers 225 without any processing. In other cases, the column amplifiers 225 may process the counter value (e.g., to facilitate combining the counter value with the digital output associated with the residual voltage).

At the end of the integration period, the voltage $v_x$ at the node 475 may be indicative of a charge remaining on the capacitor 415 and is at a voltage less than the reference voltage $V_{REF}$. Such a remaining voltage may be referred to as a residual voltage. In this regard, the residual voltage is the voltage $v_x$ captured during the integration period that does not exceed the reference voltage $V_{REF}$ and, thus, the residual voltage is not large enough to cause the counter value to be incremented by the counter circuit 430. In an aspect, the residual voltage is indicative of a portion of the magnitude of the detector signal not encompassed by the counter value.

The residual voltage may be sampled and held using the sample, hold, and reset circuitry 435. The sample, hold, and reset circuitry 435 includes the switch 440, a capacitor 445, and a switch 450. The switch 440 may be closed (e.g., in an on state) at the end of the integration period to allow the residual voltage from the capacitor 415 to be sampled and held by the sample, hold, and reset circuitry 435. In this regard, the switch 440 may be referred to as a sample-hold switch and the capacitor 445 may be referred to as a sample-hold capacitor. In an aspect, the residual voltage may be held until a switch 460 is closed. For example, the switch 460 may be closed when a row of the unit cell array (e.g., 205) that includes the unit cell 400 is being read out. When the switch 460 is closed, the residual voltage may be provided to the analog bus 470 to be read by column circuitry (e.g., 215 and/or 225 in FIG. 2). The switch 460 may be referred to as a row-select switch, a readout switch, or a row-readout switch. In an aspect, the column circuitry may process the residual voltage, such as digitizing (e.g., digital conversion using an ADC) the residual voltage to a corresponding digital value. Once the residual voltage has been read out, the switch 450 may be closed to reset the capacitor 445.

In an aspect, the various switches 440, 450, 455, and/or 460 may be controlled by control signals provided by a control bias and timing circuitry (e.g., 235 in FIG. 2). For example, the control signals may allow the capacitor 415 to be integrating a detector signal while the residual voltage is being read out from the sample, hold, and reset circuitry 435 to the analog bus 470. Such an aspect may be referred to as integrate-while-read. Such an aspect may improve the efficiency of the unit cell 400, since the EM radiation may continually be detected and integrated, compared to a case in which the detector signal is not being integrated during a time that the residual voltage is being read out of each unit cell row-by-row. The row-select may turn off (e.g., set the switch 460 to an off state) for the particular row and will turn on for the next row. A row time may refer to the time utilized to read out each column for a given row.

Once the residual voltage is converted to a digital output corresponding to the residual voltage, the counter value may be combined with the digital output to form a combined digital output (e.g., as part of the data output signal on the data output line 250). In an aspect, the combined digital output may form a portion (e.g., a pixel) of an image (e.g., IR image) generated based on EM radiation captured by the unit cell 400. In some cases, the digital output corresponding to the residual output and/or the counter value may be processed (e.g., calibrated, scaled, aligned) so that they may be combined to form a combined digital output indicative of the magnitude of the detector signal captured during the integration period. Such processing may be performed on-chip and/or off-chip.

In an aspect, the counter value may form, or may be processed to form, higher order bits (e.g., most significant bits) of the detector signal while the digital output associated with the residual voltage may form, or may be processed to form, lower order bits (e.g., least significant bits) of the detector signal. In this regard, a resolution associated with the counter value may be based on the least significant bit of the counter value, since the least significant bit is associated with the threshold value for the voltage $v_x$ that causes the counter value to be incremented. As shown in FIG. 4, the reference voltage $V_{REF}$ may be utilized as a threshold for comparison with the voltage $v_x$. Fine tuning of this resolution may be provided by the lower order bits obtained from the residual voltage.

In an aspect, the counter value provided on the digital bus 465 may be multiplexed separately from the digital output corresponding to the residual voltage on the analog bus 470. For example, the digital output may be multiplexed and converted (e.g., on-chip or off-chip) and later combined with the counter value. In another aspect, the counter value and the digital output may be multiplexed together. In such a case, the bits of the counter value and the bits generated from the residual voltage may need to be separated and processed separately (e.g., scaled, calibrated) prior to being combined together to form a combined digital output (e.g., as part of the data output signal on the data output line 250). The counter value of the counter circuit 430 may be reset (e.g., set to 0) once the counter value has been provided to the digital bus 465. The counter value may then be incremented during a next integration period.

Figure 7:
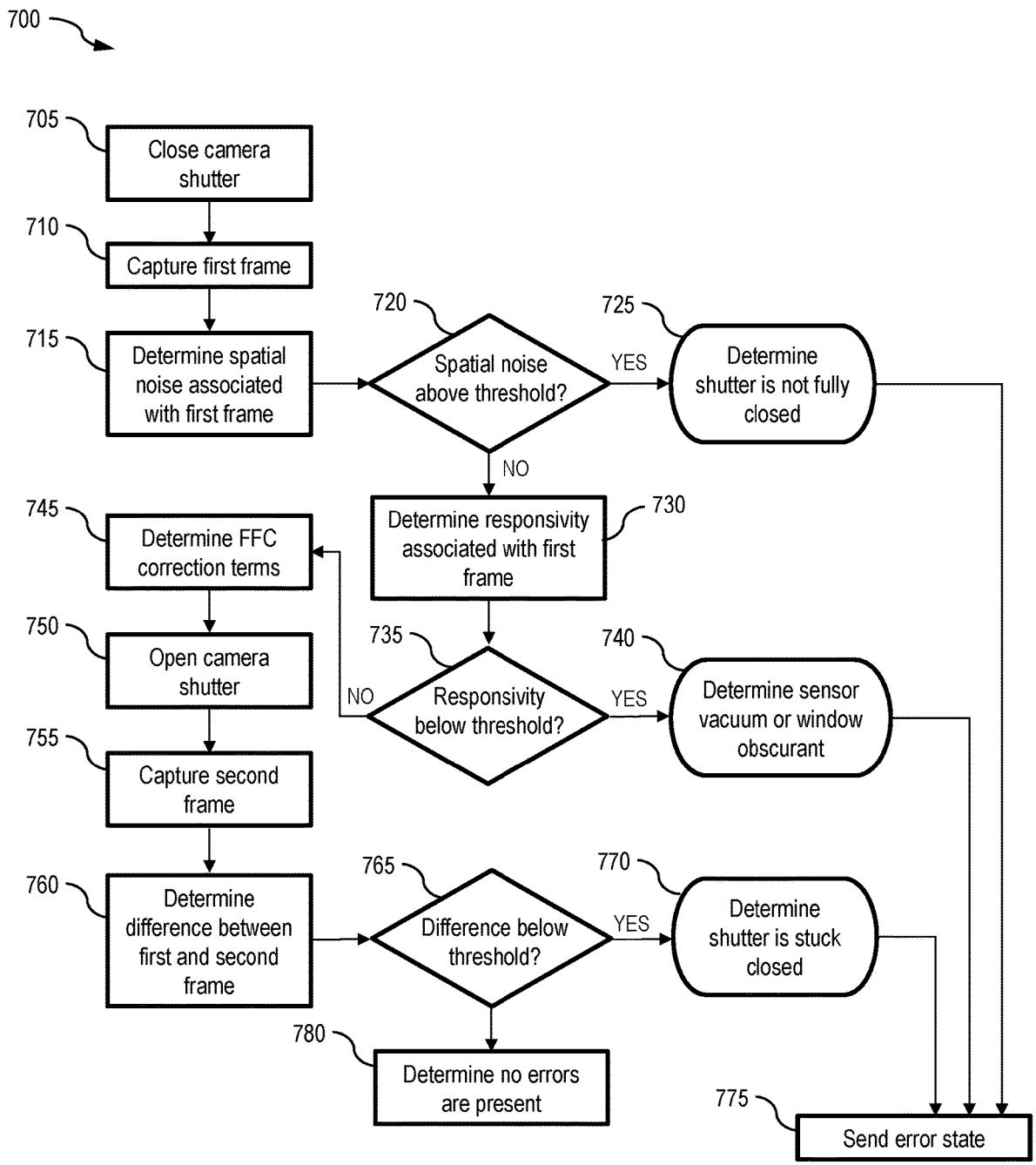
FIG. 7 illustrates a flow diagram of an example process for facilitating integrity verification based on a flat-field correction event using the image sensor assembly of FIG. 2 in accordance with one or more embodiments of the present disclosure.

FIG. 7 illustrates a flow diagram of an example process 700 for facilitating integrity verification based on an FFC event using the image sensor assembly 200 of FIG. 2 in accordance with one or more embodiments of the present disclosure. Although the process 700 is primarily described herein with reference to the image sensor assembly 200 of FIG. 2 for explanatory purposes, the process 700 can be performed in relation to other systems for facilitating performing of FFC events and integrity verification based on the FFC events. Note that one or more operations in FIG. 7 may be combined, omitted, and/or performed in a different order as desired.

At block 705, the shutter 290 is closed (e.g., positioned, moved into position) to block the unit cell array 205 from a scene. At block 710, the unit cell array 205 (e.g., the active unit cells of the unit cell array 205) captures a frame containing image data of the shutter 290. Such a frame may be referred to as an FFC frame. At block 715, a spatial noise associated with the frame captured at block 710 is determined. The spatial noise may be quantified as a pixel to pixel deviation in an output of the unit cell array 205. For example, the spatial noise may be or may be based on a standard deviation of pixel outputs of the unit cell array 205. In some cases, the determination may be made by a processor downstream of the ROIC. The processor may be part of the processor component 105 of FIG. 1 and may receive the FFC frame from the data output line 250.

At block 720, a determination is made (e.g., by the processor) as to whether the spatial noise is above a spatial noise threshold. If the spatial noise is determined to be above the spatial noise threshold, the process 700 proceeds to block 725. At block 725, a determination is made (e.g., by the processor) that the shutter 290 is not fully closed. In this regard, the spatial noise being high may be indicative of the shutter 290 not being fully closed (e.g., at least partially stuck open) and thus not blocking the scene from the unit cell array 205. In some cases, the shutter 290 may be partially stuck open such that a subset of active unit cells of the unit cell array 205 are blocked from the scene and another subset of active unit cells are not blocked from the scene. At block 775, an error state indicative of the shutter 290 not being fully closed is sent (e.g., to facilitate mitigation action by a user).

If the spatial noise is determined not to be above the spatial noise threshold, the determination at 720 is that the shutter 290 may be fully closed and the process 700 proceeds to block 730. At block 730, a responsivity associated with the frame captured at block 710 is determined. In an aspect, the responsivity is defined as a response of the unit cell array 205 in digital counts for a unit change in scene temperature. The responsivity may be determined based on measurements at different temperatures. The responsivity may be determined at block 730 based on the frame captured at block 710 and a previous FFC frame (e.g., a frame captured during a previous FFC event).

In some cases, the responsivity may be determined by computing a difference between a mean digital count value of the current FFC frame captured at block 710 and the previous FFC frame, computing a difference between a temperature of the shutter 290 when the current FFC frame is captured and when the previous FFC frame is captured, and dividing these two differences. The mean digital count value may be an average of the digital count values generated from detector outputs of the unit cells of the unit cell array 205. As an example, consider a current FFC event (e.g., associated with the frame captured at block 710) during which a temperature of the shutter 290 is 25° C. and a mean digital count value is 20,000 counts and a previous FFC event (e.g., associated with the previous FFC frame) during which a temperature of the shutter 290 is 30° C. and the mean digital count value is 21,000 counts. The responsivity in this example is (21,000−20,000)/(30−25)=200 counts/° C. The temperature of the shutter 290 may be measured using a thermistor or other temperature sensor attached to the shutter 290. In some aspects, greater temperature differences may provide more accurate measurements. In some cases, to leverage this characteristic, the mean digital count and shutter temperature for a first shutter event performed at startup of the image sensor assembly 200 may be stored and used as a reference point for all subsequent shutter events.

At block 735, a determination is made (e.g., by the processor) as to whether the responsivity is below a responsivity threshold. If the responsivity is determined to be below the responsivity threshold, the process 700 proceeds to block 740. At block 740, a determination is made (e.g., by the processor) of a presence of an error state(s) associated with the unit cell array 205. In an aspect, the responsivity being below the responsivity threshold may be indicative of a degraded vacuum associated with the unit cell array 205 (e.g., such as when the detectors are microbolometers) and/or a presence of an optical obscurant(s). In this regard, in certain architectures, the unit cell array 205 may have an FPA window and/or one or more other optical elements (e.g., lenses) along an optical path. For example, a lens may be between the shutter 290 and the detectors of the unit cell array 205. An obscurant may be dust, imperfection, and/or generally any object or feature on an optical element (e.g., lens, window, prism, etc.) along an optical path of the unit cell array 205. At block 775, an error state is sent (e.g., to facilitate mitigation action by a user). For example, the error state may indicate to the user that the vacuum is degraded and/or an obscurant is present along an optical path to facilitate mitigation and/or further analysis by the user.

In an embodiment, although the use of the shutter 290 during the FFC event provides an accurate measurement of responsivity, this method does not verify that optical elements beyond the shutter 290 are clear of obscurants. In the case of optical coating degradation or obscurants such as water, ice, snow, dirt, or other debris on external surfaces, the responsivity of the image sensor assembly 200 and/or other components of an imaging system that includes the image sensor assembly 200 may be degraded. Since the content of the scene is not known during an FFC event, a dynamic range of the scene may not be predictable. In some cases, however, if the image created by the imaging system has a very low range (e.g., a difference between a highest count value of a frame and a lowest count value of the frame is small), an obscurant may be presumed to be present. Since the image sensor assembly 200 may be imaging a very uniform scene, such as a wall, whether an error state is present cannot be absolutely asserted. However, higher level elements in the imaging system can compare information from other sensors with this warning to better determine if an error state is present. For example, in an automotive application, this may be treated as an error if the vehicle is in motion and ignored if the vehicle is parked.

If the responsivity is determined not to be below the responsivity threshold, the process 700 proceeds to block 745. At block 745, FFC calibration terms are generated (e.g., by the processor) based on the frame captured at block 710. At block 750, the shutter 290 is open (e.g., positioned, moved into position) such that the shutter 290 does not block the unit cell array 205 from the scene. In some aspects, blocks 705, 710, 745, and 750 may collectively be referred to as an FFC event. At block 755, the unit cell array 205 (e.g., the active unit cells of the unit cell array 205) captures a frame containing image data of the scene.

At block 760, a difference between the frame captured at block 710 and the frame captured at block 755 is determined (e.g., by the processor). Although in FIG. 7 a single frame is captured at block 710 and a single frame is captured at block 755, in other embodiments multiple frames may be captured at block 710 and/or multiple frames may be captured at block 755. The frames captured at block 710 may be averaged to generate an average frame (e.g., an average FFC frame) and/or the frames captured at block 755 may be averaged to generate an average frame, and the difference may be determined based on the averaged frames.

At block 765, a determination is made (e.g., by the processor) as to whether the difference is below a difference threshold. If the difference is determined to be below the difference threshold, the process 700 proceeds to block 770. At block 770, a determination is made (e.g., by the processor) that the unit cell array 205 is stuck closed. In this regard, if the frame captured at block 710 (e.g., when the shutter 290 is blocking the unit cell array 205) and the frame captured at block 755 (e.g., when the shutter 290 is supposedly not blocking the unit cell array 205), the difference being below the difference threshold may be indicative of the shutter 290 being closed (e.g., stuck closed) when the frame is captured at 755. At block 775, an error state indicative of the shutter 290 being stuck closed is sent (e.g., to facilitate mitigation action by a user). If the difference is determined not to be below the difference threshold, the process 700 proceeds to block 780. At block 780, a determination is made that no errors detected for by the process 700 are present.

An error state may be communicated to the user via, by way of non-limiting examples, a display on a user device (e.g., mobile phone), a display on a camera that includes the image sensor assembly 200, and/or via other manners. Such an alert may be a visible alert, such as text or pulses of light emitted by light emitting diodes communicatively coupled to the image sensor assembly 200, and/or an audible alert, such as beeping by a speaker communicatively coupled to the imaging device. In some cases, the user is alerted wherever an error associated with the image sensor assembly 200 is detected. In some cases, the user is not alerted of an error(s) associated with the image sensor assembly 200. In some cases, whether and how the image sensor assembly 200 responds to a detected error, such as whether to alert the user of an error(s) and/or stop imaging operation of the image sensor assembly 200, may be based on application (e.g., application-specific safety requirements), manufacturer preferences, user preferences, and/or other considerations.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. An imaging device comprising:
a focal plane array (FPA) comprising:
a detector array comprising a plurality of detectors, wherein each of the plurality of detectors is configured to detect electromagnetic radiation to obtain image data; and
a readout circuit configured to perform a readout to obtain the image data from each of the plurality of detectors;
a verification circuit configured to generate a first cyclic redundancy code (CRC) based on the image data from each of the plurality of detectors; and
a processing circuit configured to:
receive, via a data output interface, the first CRC and the image data from each of the plurality of detectors;
generate a second CRC based on the image data received via the data output interface; and
perform a verification of the imaging device based at least on the image data, wherein the verification of the imaging device comprises a verification of the data output interface based at least on the first CRC and the second CRC.

2. The imaging device of claim 1, wherein the processing circuit is further configured to transmit a notification based on the verification of the imaging device, wherein the notification comprises an error notification indicative of a type of error detected in the FPA.

3. The imaging device of claim 1, further comprising a bias circuit configured to inject a respective set of signals into each detector of a subset of the plurality of detectors, wherein the image data of each detector of the subset is based at least on the respective injected signal, and wherein the verification of the imaging device further comprises a verification of the readout circuit based at least on the image data.

4. The imaging device of claim 3, further comprising a parallel data interface configured to receive the sets of signals from the bias circuit and provide each respective set of signals to a corresponding detector of the subset, wherein the verification of the imaging device further comprises a verification of the parallel data interface.

5. The imaging device of claim 3, wherein the subset of the plurality of detectors comprises:
a plurality of rows of detectors, wherein the processing circuit is configured to, for each row of the plurality of rows of detectors, generate a checksum for the row based on the image data from each detector of the row, and wherein the verification of the imaging device further comprises a verification of a row order of the readout circuit; and/or
a plurality of columns of detectors, wherein the processing circuit is configured to, for each column of the plurality of columns of detectors, generate a checksum for the column based on the image data from each detector of the column, and wherein the verification of the imaging device further comprises a verification of a column order of the readout circuit.

6. The imaging device of claim 1, wherein:
the readout circuit comprises a plurality of column amplifiers, wherein each of the plurality of column amplifiers is configured to receive the image data from detectors of a respective column of the detector array and amplify the image data to obtain amplified image data,
the verification of the imaging device further comprises a verification of the plurality of column amplifiers based at least on the amplified image data,
the readout circuit is configured to associate the image data with a frame number, and
the verification of the imaging device is further based at least on the frame number.

7. The imaging device of claim 1, further comprising:
a first memory configured to store a first copy of a set of parameters and a second memory configured to store a second copy of the set of parameters, wherein the processing circuit is configured to perform the verification of the imaging device at least by comparing the first copy with the second copy;
an inertial measurement unit configured to determine motion data associated with a scene, wherein the image data is associated with the scene, and wherein the verification of the imaging device is further based at least on the motion data and the image data.

8. The imaging device of claim 1, wherein:
the detector array is configured to detect the electromagnetic radiation from a first portion of a scene;
the processing circuit is further configured to receive, from a second imaging device, image data associated with a second portion of the scene;
the first portion at least partially overlaps the second portion; and
the verification of the imaging device is further based on a difference between the image data from each of the plurality of detectors of the FPA and the image data from the second imaging device.

9. An imaging device comprising:
a focal plane array (FPA) comprising:
a detector array comprising a plurality of detectors, wherein each of the plurality of detectors is configured to detect electromagnetic radiation to obtain image data; and
a readout circuit configured to perform a readout to obtain the image data from each of the plurality of detectors;
a bias circuit configured to inject a respective set of signals into each detector of a subset of the plurality of detectors, wherein the image data of each detector of the subset is based at least on the respective injected signal; and
a processing circuit configured to perform a verification of the imaging device based at least on the image data, wherein the verification of the imaging device further comprises a verification of the readout circuit based at least on the image data,
wherein the subset of the plurality of detectors comprises:
a plurality of blind detectors;
a plurality of rows of detectors, wherein the processing circuit is configured to, for each row of the plurality of rows of detectors, generate a checksum for the row based on the image data from each detector of the row, and wherein the verification of the imaging device comprises a verification of a row order of the readout circuit; and/or
a plurality of columns of detectors, wherein the processing circuit is configured to, for each column of the plurality of columns of detectors, generate a checksum for the column based on the image data from each detector of the column, and wherein the verification of the imaging device further comprises a verification of a column order of the readout circuit.

10. The imaging device of claim 9, further comprising a shutter configured to selectively block the detector array, wherein the detector array is configured to capture an image comprising the image data from each of the plurality of detectors when the shutter blocks the detector array, and wherein the verification of the imaging device further comprises a verification of the FPA and/or the shutter based on the image, and
wherein the processing circuit is configured to:
determine a spatial noise associated with the image, wherein the verification of the imaging device is further based on the spatial noise; and/or
determine a responsivity associated with the image, wherein the verification of the imaging device is further based on the responsivity.

11. The imaging device of claim 10, wherein:
the image is a first image captured during a first time duration;
the detector array is further configured to capture a second image when the shutter blocks the detector array during a second time duration; and
the processing circuit is configured to determine the responsivity based on the first image, the second image, a temperature of the shutter associated with the first time duration, and a temperature of the shutter associated with the second time duration.

12. An imaging device comprising:
a focal plane array (FPA) comprising:
a detector array comprising a plurality of detectors, wherein each of the plurality of detectors is configured to detect electromagnetic radiation to obtain image data; and
a readout circuit configured to perform a readout to obtain the image data from each of the plurality of detectors; and
a processing circuit configured to:
perform a verification of the imaging device based at least on the image data;
generate a first cyclic redundancy code (CRC) based on a serial data command word, wherein the serial data command word is associated with setting an operation of the readout circuit; and
transmit, over a data line, the first CRC and the serial data command word; and
the readout circuit is further configured to:
receive, via the data line, the first CRC and the serial data command word;
generate a second CRC based on the serial data command word; and
wherein the verification of the imaging device comprises a verification of the data line based at least on the first and second CRCs.

13. A method comprising:
detecting, by a plurality of detectors of a focal plane array (FPA) of an imaging device, electromagnetic radiation;
blocking, by a shutter, the plurality of detectors;
capturing an image comprising image data from each of the plurality of detectors when the shutter blocks the plurality of detectors;
performing, by a readout circuit of the FPA, a readout to obtain the image data from each of the plurality of detectors; and
performing a verification of the imaging device based at least on the image data, wherein the verification of the imaging device comprises a verification of the FPA and/or the shutter based on the image; and
the method further comprising:
determining a spatial noise associated with the image, wherein the verification of the imaging device is based at least in part on the spatial noise; and/or
determining a responsivity associated with the image, wherein the verification of the imaging device is based at least in part on the responsivity.

14. The method of claim 13, further comprising injecting a respective set of signals into each detector of a subset of the plurality of detectors, wherein the image data of each detector of the subset is based at least on the respective injected signal, and wherein the verification of the imaging device further comprises a verification of the readout circuit based at least on the image data, wherein the subset of the plurality of detectors comprises:
a plurality of rows of detectors, wherein the method further comprises, for each row of the plurality of rows of detectors, generating a checksum for the row based on the image data from each detector of the row, and wherein the verification of the imaging device further comprises a verification of a row order of the readout circuit; and/or
a plurality of columns of detectors, wherein the method further comprises, for each column of the plurality of columns of detectors, generating a checksum for the column based on the image data from each detector of the column, and wherein the verification of the imaging device further comprises a verification of a column order of the readout circuit.

15. The method of claim 14, wherein the subset of the plurality of detectors further comprises a plurality of blind detectors, wherein each respective set of signals is provided to a corresponding detector of the subset via a parallel data interface, and wherein the verification of the imaging device further comprises a verification of the parallel data interface.

16. The method of claim 13, wherein a detector array comprises the plurality of detectors, the method further comprising:
transmitting a notification based on the verification of the imaging device, wherein the notification comprises an error notification indicative of a type of error detected in the FPA;
receiving, by each of a plurality of column amplifiers of the readout circuit, the image data from detectors of a respective column of the detector array; and
amplifying, by each of the plurality of column amplifiers, the image data from the detectors of the respective column to obtain amplified image data,
wherein the verification of the imaging device further comprises a verification of the plurality of column amplifiers based at least on the amplified image data.

17. The method of claim 13, further comprising:
generating a first cyclic redundancy code (CRC) based on the image data from each of the plurality of detectors;
receiving, via a data output interface, the first CRC and the image data from each of the plurality of detectors; and
generating a second CRC based on the image data received via the data output interface,
wherein the verification of the imaging device further comprises a verification of the data output interface based at least on the first and second CRCs.

18. The method of claim 13, wherein:
the image is a first image captured during a first time duration;
the method comprises determining the responsivity;
the method further comprises capturing a second image when the shutter blocks the plurality of detectors during a second time duration; and
wherein the responsivity is determined based on the first image, the second image, a temperature of the shutter associated with the first time duration, and a temperature of the shutter associated with the second time duration; and the method further comprising:
storing a first copy of a set of parameters in a first memory; and
storing a second copy of the set of parameters in a second memory,
wherein the performing comprises comparing the first copy with the second copy, and
determining, by an inertial measurement unit, motion data associated with a scene, wherein the image data is associated with the scene, and wherein the verification of the imaging device is further based at least on the motion data and the image data.

19. The method of claim 13, wherein the electromagnetic radiation is detected from a first portion of a scene, wherein the method further comprises receiving, from a second imaging device, image data associated with a second portion of the scene, wherein the first portion at least partially overlaps the second portion, and wherein the verification of the imaging device is based on a difference between the image data from each of the plurality of detectors of the FPA and the image data from the second imaging device.

20. The method of claim 13, further comprising:
generating, by a processing circuit coupled to the readout circuit via a data line, a first cyclic redundancy code (CRC) based on a serial data command word, wherein the serial data command word is associated with setting an operation of the readout circuit;
transmitting, by the processing circuit over the data line, the first CRC and the serial data command word;
receiving, by the readout circuit via the data line, the first CRC and the serial data command word; and
generating, by the readout circuit, a second CRC based on the serial data command word,
wherein the verification of the imaging device further comprises a verification of the data line based at least on the first and second CRCs.

* * * * *